(12) United States Patent
Kim (10) Patent No.: US 11,264,100 B2
(45) Date of Patent: Mar. 1, 2022

(54) MEMORY DEVICE AND OPERATION METHOD THEREOF

(71) Applicant: SK hynix Inc., Gyeonggi-do (KR)

(72) Inventor: Younggyun Kim, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 67 days.

(21) Appl. No.: 16/906,700

(22) Filed: Jun. 19, 2020

(65) Prior Publication Data
US 2021/0193227 A1    Jun. 24, 2021

(30) Foreign Application Priority Data
Dec. 23, 2019    (KR) ........................ 10-2019-0173110

(51) Int. Cl.
| | | |
|---|---|---|
| G11C 16/04 | (2006.01) | |
| G11C 13/00 | (2006.01) | |
| G11C 16/10 | (2006.01) | |
| G11C 16/24 | (2006.01) | |
| G11C 16/08 | (2006.01) | |
| G11C 16/34 | (2006.01) | |
| G06F 3/06 | (2006.01) | |
| G11C 16/26 | (2006.01) | |

(52) U.S. Cl.
CPC ............ *G11C 16/10* (2013.01); *G06F 3/0604* (2013.01); *G06F 3/0655* (2013.01); *G06F 3/0679* (2013.01); *G11C 16/08* (2013.01); *G11C 16/24* (2013.01); *G11C 16/26* (2013.01); *G11C 16/3459* (2013.01); *G11C 16/0483* (2013.01)

(58) Field of Classification Search
CPC combination set(s) only.
See application file for complete search history.

(56) References Cited

U.S. PATENT DOCUMENTS

| | | | |
|---|---|---|---|
| 8,526,241 B2 | 9/2013 | Shirakawa | |
| 10,755,795 B2* | 8/2020 | Choi | G11C 29/50004 |
| 10,998,063 B1* | 5/2021 | Tang | G11C 16/10 |
| 11,100,997 B2* | 8/2021 | Lee | G11C 16/10 |
| 2016/0078946 A1* | 3/2016 | Byun | G11C 16/0483 |
| | | | 365/185.12 |
| 2017/0084345 A1* | 3/2017 | Yang | G11C 16/34 |
| 2018/0102172 A1* | 4/2018 | Yi | G06F 11/1048 |
| 2019/0206508 A1* | 7/2019 | Choi | G11C 29/24 |
| 2019/0378581 A1* | 12/2019 | Zhao | G11C 16/3427 |

* cited by examiner

*Primary Examiner* — Hien N Nguyen
(74) *Attorney, Agent, or Firm* — IP & T Group LLP (57) ABSTRACT

An operation method of a memory device may include performing a program operation on a memory block in response to a program command from a controller, and applying a program voltage to a dummy word line coupled to dummy cells within the memory block such that the dummy cells have an indication threshold voltage higher than a normal pass voltage and providing a program fail signal to the controller when the program operation fails.

12 Claims, 5 Drawing Sheets

MEMORY DEVICE AND OPERATION METHOD THEREOF

CROSS-REFERENCE TO RELATED APPLICATION

This application claims priority under 35 U.S.C. § 119 to Korean Patent Application No. 10-2019-0173110 filed on Dec. 23, 2019, which is incorporated herein by reference in its entirety.

BACKGROUND

1. Field

Various embodiments of the present disclosure relate to a memory device.

2. Discussion of the Related Art

Recently, the paradigm for the computing environment has changed to a ubiquitous computing environment in which computer systems can be used virtually anytime and anywhere. Therefore, the use of portable electronic devices such as mobile phones, digital cameras and notebook computers has rapidly increased. Such potable electronic devices generally use a memory system utilizing a memory device, that is, a data storage device. The data storage device may be used as a main or secondary memory device of the portable electronic device.

Since the data storage device using a memory device has no mechanical driver, the data storage device has excellent stability and durability, high information access speed, and low power consumption. As an example of the memory systems having such advantages, the data storage device includes a universal serial bus (USB) memory device, a memory card having various interfaces, a solid state drive (SSD) and the like.

SUMMARY

Various embodiments are directed to a memory device capable of guaranteeing reliability by retaining data of a memory block even when a progressive defect occurs in the corresponding memory block, and an operation method thereof.

In an embodiment, an operation method of a memory device may include: performing a program operation on a memory block in response to a program command from a controller; and applying a program voltage to a dummy word line coupled to dummy cells within the memory block such that the dummy cells have an indication threshold voltage higher than a normal pass voltage, and providing a program fail signal to the controller when the program operation fails.

In an embodiment, a memory device may include: a memory block comprising memory cells and dummy cells; a main word line coupled to the memory cells; a dummy word line coupled to the dummy cells; a voltage supply circuit suitable for: performing a program operation on the memory block in response to a program command from a controller, and applying a program voltage to the dummy word line such that the dummy cells have an indication threshold voltage higher than a normal pass voltage when the program operation fails; and a control logic suitable for providing a program fail signal to the controller when the program operation fails.

In an embodiment, an operating method of a memory device, the operating method may include: applying, in response to a program command for a program-failed cell array, a program voltage to a dummy word line coupled to dummy cells within the program-failed cell array; and providing, in response to a subsequent program command for the program-failed cell array, a program-failure signal when sensing failure-mark data from the program-failed cell array.

In accordance with the present embodiments, it is possible to provide a memory device capable of guaranteeing reliability by retaining data of a memory block even when a progressive defect occurs in the corresponding memory block, and an operation method thereof.

DETAILED DESCRIPTION

Hereafter, exemplary embodiments of the present invention will be described in detail with reference to the accompanying drawings. It should be understood that the following descriptions will be focused on portions required for understanding an operation in accordance with an embodiment, and descriptions of the other portions will be ruled out in order not to unnecessarily obscure subject matters of the present disclosure.

Hereafter, various embodiments will be described in detail with reference to the accompanying drawings.

Figure 1:
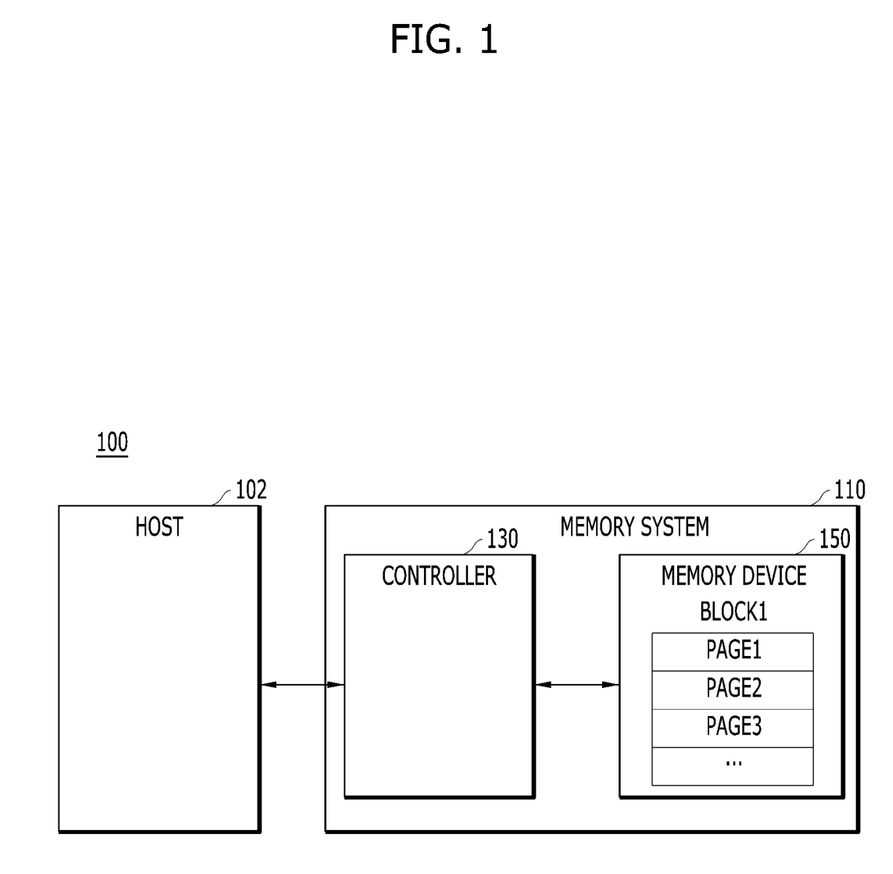
FIG. 1 is a diagram illustrating a data processing system including a memory device in accordance with an embodiment of the present disclosure.

FIG. 1 is a diagram schematically illustrating an example of a data processing system 100 including a memory device 150 in accordance with an embodiment of the present disclosure.

Referring to FIG. 1, the data processing system 100 may include a host 102 and a memory system 110.

The host 102 may include electronic devices, for example, portable electronic devices such as a mobile phone, MP3 player and laptop computer or electronic devices such as a desktop computer, game machine, TV and projector.

The host 102 may include one or more OSs (Operating System). The OS manages and controls overall functions and operations of the host 102, and provides an interactive operation between the host 102 and a user who uses the data processing system 100 or the memory system 110. The OS may support a function and operation corresponding to the purpose of use of a user, and be divided into a general OS and a mobile OS depending on the mobility of the host 102. Among the OSs, the general OS may be divided into a personal OS and an enterprise OS depending on the use environment of a user.

The memory system 110 may operate to store data of the host 102 in response to a request of the host 102. For example, the memory system 110 may be implemented as any one of various types of storage devices including an SSD (Solid State Drive), an MMC (Multi Media Card) such as an eMMC (embedded MMC), RS-MMC (reduced size MMC) or micro-MMC, an SD (Secure Digital) card such as a mini-SD or micro-SD card, a USB (Universal Serial Bus)

storage device, a UFS (Universal Flash Storage) device, a CF (Compact Flash) card, a smart media card and a memory stick.

The memory system 110 may be implemented by various types of storage devices. For example, the storage device may include volatile memory devices such as a DRAM (Dynamic Random Access Memory) and SRAM (Static RAM) and nonvolatile memory devices such as a ROM (Read Only Memory), MROM (Mask ROM), PROM (Programmable ROM), EPROM (Erasable ROM), EEPROM (Electrically Erasable ROM), FRAM (Ferromagnetic ROM), PRAM (Phase change RAM), MRAM (Magnetic RAM), RRAM (Resistive RAM), resistive RAM (RRAM) and flash memory. The flash memory may have a 3D stack structure.

The memory system 110 may include the memory device 150 and a controller 130. The memory device 150 may store data for the host 102, and the controller 130 may control data storage into the memory device 150.

The controller 130 and the memory device 150 may be integrated as one semiconductor device. For example, the controller 130 and the memory device 150 may be integrated as one semiconductor device to constitute an SSD. When the memory system 110 is used as an SSD, the operating speed of the host 102 coupled to the memory system 110 may be improved. Furthermore, the controller 130 and the memory device 150 may be integrated as one semiconductor device to constitute a memory card. For example, the controller 130 and the memory device 150 may constitute a memory card such as a PC card (PCMCIA: Personal Computer Memory Card International Association), a CF card, an SMC (Smart Media Card), a memory stick, an MMC such as RS-MMC or MMCmicro, an SD card such as miniSD, microSD or SDHC, and a UFS device.

For another example, the memory system 110 may constitute a computer, an UMPC (Ultra Mobile PC), a workstation, a net-book, a PDA (Personal Digital Assistant), a portable computer, a web tablet, a tablet computer, a wireless phone, a mobile phone, a smart phone, an e-book, a PMP (Portable Multimedia Player), a portable game machine, a navigation system, a black box, a digital camera, a DMB (Digital Multimedia Broadcasting) player, a 3-dimensional television, a smart television, a digital audio recorder, a digital audio player, a digital picture recorder, a digital picture player, a digital video recorder, a digital video player, a storage constituting a data center, a device capable of transmitting/receiving information in a wireless environment, one of various electronic devices constituting a home network, one of various electronic devices constituting a computer network, one of various electronic devices constituting a telematics network, an RFID (Radio Frequency Identification) device, or one of various components constituting a computing system.

The memory device 150 may be a nonvolatile memory device, and retain data stored therein even though no power is supplied. The memory device 150 may store data provided from the host 102 through a program operation, and provide data stored in the memory device 150 to the host 102 through a read operation. The memory device 150 may include a plurality of memory blocks, each of the memory blocks may include a plurality of pages, and each of the pages may include a plurality of memory cells coupled to a word line. In an embodiment, the memory device 150 may be a flash memory. The flash memory may have a 3D stack structure.

The controller 130 may control the memory device 150 in response to a request from the host 102. For example, the controller 130 may provide the host 102 with data read from the memory device 150, and store data provided from the host 102 in the memory device 150. For this operation, the controller 130 may control read, program and erase operations of the memory device 150.

For example, the controller 130 may receive a write command and write data from the host 102. The controller 130 may generate program commands for the plurality of pages in order to store the data in the memory device 150 in response to the write command. The controller 130 may provide the generated program commands and the data to the memory device 150.

FIG. 1 illustrates a first block BLOCK1 among the plurality of memory blocks included in the memory device 150 and a plurality of pages included in the first block BLOCK1. The controller 130 may generate program commands in order of first to third pages PAGE1 to PAGE3 of the first block BLOCK1, and provide the program commands to the memory device 150. In order to rapidly process the write command, the controller 130 may perform an operation of generating a program command and providing the generated command to the memory device 150 according to a pipeline scheme. For example, the controller 130 may generate program commands for the second and third pages PAGE2 and PAGE3 while providing a program command for the first page PAGE1 to the memory device 150.

When stress is accumulated on a word line or the like while a user uses the memory device 150, a progressive defect may occur in a memory block. That is, although a memory block has been normally operated during a test before shipment of the memory device 150, a defect may occur in the memory block afterwards. A program operation cannot be normally performed in a defective block. For example, when the memory device 150 programs data to a defective memory block, the data may not be programmed as intended which causes a program fail.

When a result obtained by performing a program operation on the first block BLOCK1 indicates that a program fail occurred, the memory device 150 may provide the controller 130 with a program fail signal for the first block BLOCK1. Since the first block BLOCK1 may have a defect, the controller 130 may determine the first block BLOCK1 to be a defective block. The controller 130 may not generate a program command for the defective block so that a program operation is not performed on the defective block any more.

Even after the controller 130 determines the first block BLOCK1 to be a defective block, the memory device 150 may perform a program operation on the first block BLOCK1. For example, since the controller 130 operates according to the pipeline scheme, the controller 130 may generate and provide program commands for the second page PAGE2 and the third page PAGE3 before the first block BLOCK1 is determined to be a defective block. However, depending on the cause of a defective memory block, the defective memory block may worsen when a program operation is performed on the defective memory block. When the defective block worsens, data already programmed in the defective block may be damaged.

However, cancelling the generating or providing of the program commands for the second and third pages PAGE2 and PAGE3 by the controller 130 in order to protect the data stored in the defective first block BLOCK1 may degrade the performance of the memory system 110. That is because the controller 130 needs to stop the operation of the pipeline scheme in order to cancel the generating or providing of the program command.

In accordance with an embodiment of the present disclosure, the memory device 150 may interrupt a program operation on a defective block even though a program command for the defective block is provided after a program fail has occurred in a memory block and the memory block is determined to be a defective block. Although the controller 130 provides the memory device 150 with a program command for a defective block without stopping the operation of the pipeline scheme, a program operation on the defective block may not be performed. Therefore, while the reliability of data stored in the defective block is secured, the performance of the memory system 110 may be improved.

The structure and operation of the memory device 150 in accordance with various embodiments will be described with reference to FIGS. 2 to 5.

Figure 2:
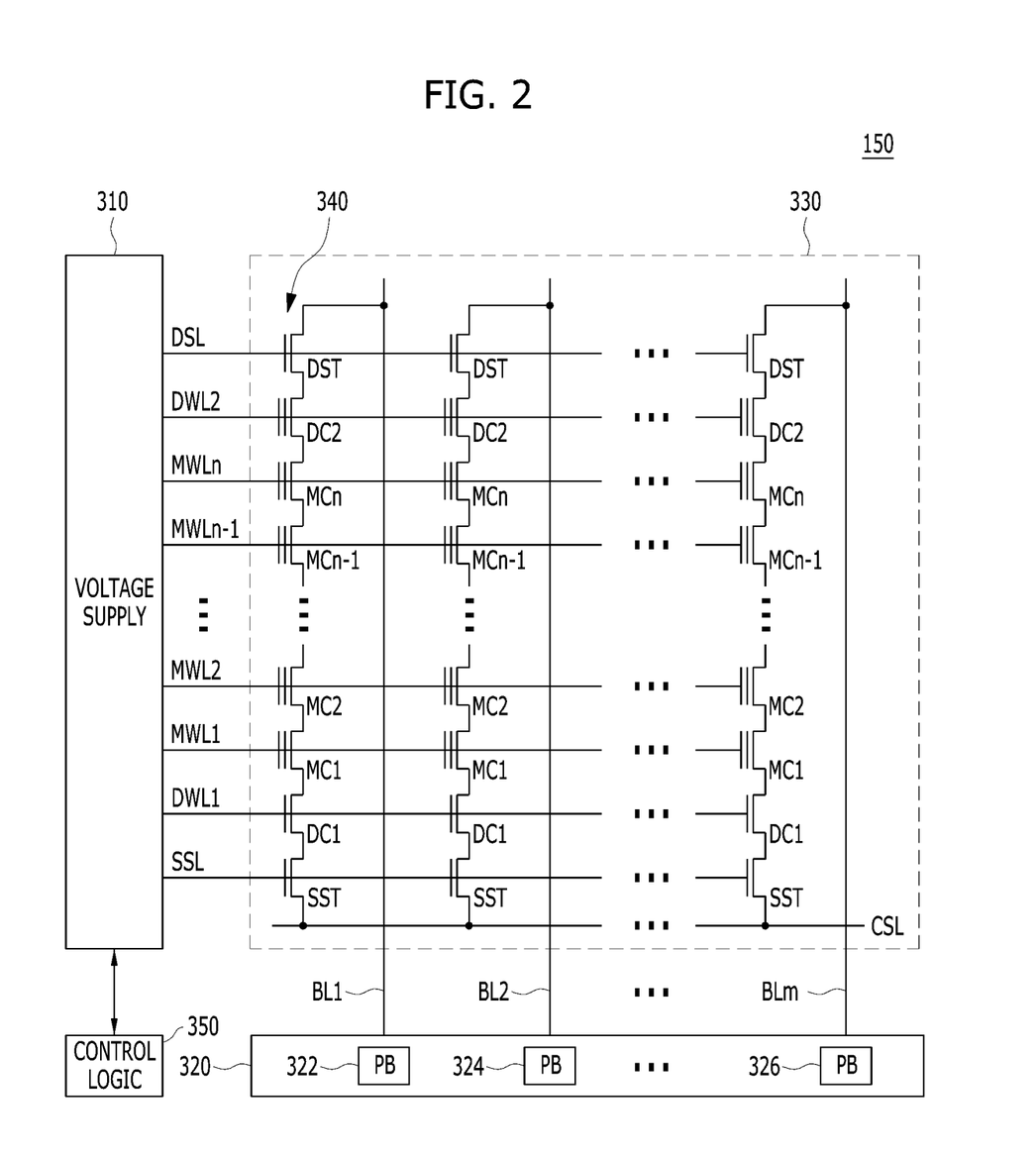
FIG. 2 is a diagram illustrating a memory device in accordance with an embodiment of the present disclosure.

FIG. 2 is a diagram illustrating the structure of the memory device 150 in accordance with an embodiment.

The memory device 150 may include a voltage supply circuit 310, a read/write circuit 320, a memory cell array 330 and a control logic 350.

The memory cell array 330 may include a plurality of memory blocks. The plurality of memory blocks may be coupled to the voltage supply circuit 310 through a drain select line DSL, a plurality of word lines and a source selected line SSL. The plurality of memory blocks may be coupled to the read/write circuit 320 through a plurality of bit lines BL1 to BLm. FIG. 2 exemplifies the memory cell array 330 including a single memory block.

Referring to FIG. 2, the memory cell array 330 may include a plurality of cell strings 340 coupled to a plurality of bit lines BL1 to BLm. The cell string 340 of each column may include one or more drain select transistors DST and one or more source select transistors SST. Between the drain select transistor DST and the source select transistor SST, a plurality of memory cells MC1 to MCn may be coupled in series.

A source of the source select transistor SST may be coupled to a common source line CSL. A drain of the drain select transistor DST may be coupled to the bit line. Gates of the source select transistors SST included in different cell strings may be coupled to a source select line SSL. Gates of the drain select transistors DST may be coupled to a drain select line DSL. The memory cells MC1 to MCn may be coupled to main word lines MWL1 to MWLn. A group of memory cells coupled to the same word line among the memory cells included in different cell strings may be referred to as a physical page. In an implementation, each of the memory cells may store 1-bit data or multi-bit data therein. When each of the memory cells can store multi-bit data therein, one physical page may include a plurality of logical pages. One logical page may correspond to the minimum unit on which the memory device 150 can perform a program operation at a time. One memory block may include memory cells coupled to the plurality of main word lines. One memory block may correspond to the minimum unit on which the memory device 150 can perform an erase operation at a time.

The memory device 150 may further include dummy word lines between the select lines and the main word lines. For example, the memory device 150 may include a first dummy word line DWL1 between the source select line SSL and a first main word line MWL1, and a second dummy word line DWL2 between the drain select line DSL and an n$^{th}$ main word line MWLn. The memory block may further include dummy cells DC1 and DC2 coupled to the dummy word lines. For example, the memory device 150 may erase a memory block and then program the dummy cells DC1 and DC2 of the memory block, thereby reducing a threshold voltage difference between a select transistor and a memory cell which are adjacent to each other. As the dummy cells DC1 and DC2 are erased and then programmed, the dummy cells DC1 and DC2 may have a threshold voltage referred to as an initial threshold voltage. When the threshold voltage difference between the select transistor and the memory cell which are adjacent to each other is reduced, band-to-band tunneling may be decreased to reduce a charge loss of data stored in the memory cell.

With technological development, the degree of integration of the memory device 150 has been gradually increased. The increase in degree of integration of the memory device 150 indicates that the distance between memory cells is reduced, and the reduction in distance between memory cells indicates that the distance between adjacent word lines and the distance between adjacent bit lines are reduced. With the reductions in distance between word lines and distance between bit lines, word lines or bit lines may be unexpectedly coupled to each other. When the word lines or the bit lines are unexpectedly coupled to each other, the memory device 150 cannot perform an intended operation on a memory cell. When the memory device 150 cannot perform the intended operation on the memory cell, the reliability of a write/read operation of the memory device 150 may be reduced.

Even word lines or bits lines which have not been coupled to each other in a test step before shipment of the memory device 150 may be coupled to each other by voltage stress applied to the word lines and the bit lines while the user uses the memory device 150. When a program operation is continuously performed on a defective block associated with the word lines or bit lines coupled to each other, the memory device 150 may not be able to store normal data therein, and may also damage data already stored in the defective block.

In accordance with an embodiment of the present disclosure, when a program fail occurs in a certain memory block, the memory device 150 may apply a program voltage to a dummy word line DWL associated with the memory block, and thus increase the threshold voltage of the dummy cells DC coupled to the dummy word line DWL. The dummy work line DWL may the dummy word line DWL1, DWL2 or both shown in FIG. 2. For example, when the memory device applies the program voltage to the dummy word line DWL1, the threshold voltage of the dummy cells DC1 may increase. When performing a program operation on a certain memory block, the memory device 150 may determine whether the memory block is a defective block, based on the threshold voltage of dummy cells DC associated with the memory block. The memory device 150 may stop the program operation when determining that the memory block associated with the program operation is a defective block.

The voltage supply circuit 310 may supply a program voltage, a read voltage and a pass voltage to the word lines depending on operation modes. The voltage supply circuit 310 may generate the plurality of voltages based on an external power voltage provided to the memory device 150. The voltage supply circuit 310 may select one of the memory blocks (or sectors) of the memory cell array, select one of the word lines of the selected memory block, and provide the word line voltage to the selected word line. If necessary, the voltage supply circuit 310 may provide the word line voltage to the unselected word lines.

For example, during a read operation, the read/write circuit 320 may float the bit lines by precharging the bit lines. The voltage supply circuit 310 may apply a read voltage to a selected word line and apply a pass voltage to unselected word lines. A word line coupled to the selected memory cell may be referred to as a selected word line. A word line other than the selected word line may be referred to as an unselected word line. According to the threshold voltage of a memory cell and the voltage applied to the word line coupled to the memory cell, a current may flow through the memory cell. The read voltage is a voltage for distinguishing between data indicated by selected memory cells, and may have a value between two threshold voltage statuses among voltage statuses which the memory cells may have. The pass voltage, which can cause a current to flow regardless of the threshold voltage values of the unselected memory cells, may have a higher voltage than the threshold voltage statuses which the memory cells may have. For example, during a normal read operation, a normal pass voltage applied to a dummy word line DWL may be higher than the initial threshold voltage. The normal read operation indicates a read operation which is performed before a memory block associated with a read operation or a program verify operation is determined to be a defective block, when the memory device 150 performs the read operation or the program verify operation. When the voltage supply circuit 310 applies the read voltage and the pass voltage, a current may flow through a bit line coupled to a selected memory cell whose threshold voltage is lower than the read voltage, and no current may flow through a bit line coupled to a selected memory cell whose threshold voltage is higher than the read voltage. Depending on whether a current flows through the bit line coupled to each of the page buffers, different data may be buffered. Therefore, the threshold voltage statuses of the memory cells may be distinguished from one another according to the read operation.

The read/write circuit 320 may operate as a sense amplifier to read data from the memory cell array during a verify/normal read operation. The read/write circuit 320 may operate as a write driver for driving bit lines according to data to be stored in the memory cell array during a program operation. During the program operation, the read/write circuit 320 may receive the data, which are to be stored in the memory cell array, from a buffer (not illustrated), and drive bit lines according to the received data. The read/write circuit 320 may include a plurality of page buffers 322 to 326 each corresponding to a bit line or a bit line pair, and each of the page buffers 322 to 326 may include a plurality of latches (not illustrated). The page buffers 322 to 326 may be coupled to the memory cell array 330 through the bit lines BL1 to BLm.

The plurality of page buffers 322 to 326 may buffer data received with a program command from the controller 130. During a program operation, the plurality of page buffers may transfer the buffered data to selected memory cells through the bit lines BL1 to BLm. During the program verify operation, the page buffers 322 to 326 may sense data from the selected memory cells through the bit lines BL1 to BLm. During the read operation, the page buffers 322 to 326 may sense data from the memory cells of the selected page through the bit lines BL1 to BLm and may output the sensed data to a data input/output circuit (not illustrated). During the erase operation, the page buffers 322 to 326 may float the bit lines BL1 to BLm.

The control logic 350 may receive a command and an address from the controller 130. The control logic 350 may control the voltage supply circuit 310 and the read/write circuit 320 in response to the command and the address. For example, the control logic 350 may operate the read/write circuit 320 as a sense amplifier or write driver according to the command. The control logic 350 may transfer the command and the address to the voltage supply circuit 310, and control the voltage supply circuit 310 to supply the program voltage, the read voltage, the pass voltage and the like to the selected word line and the unselected word lines.

The operation of the memory device 150 in accordance with an embodiment will be described in detail with reference to FIGS. 3 to 5.

Figure 3:
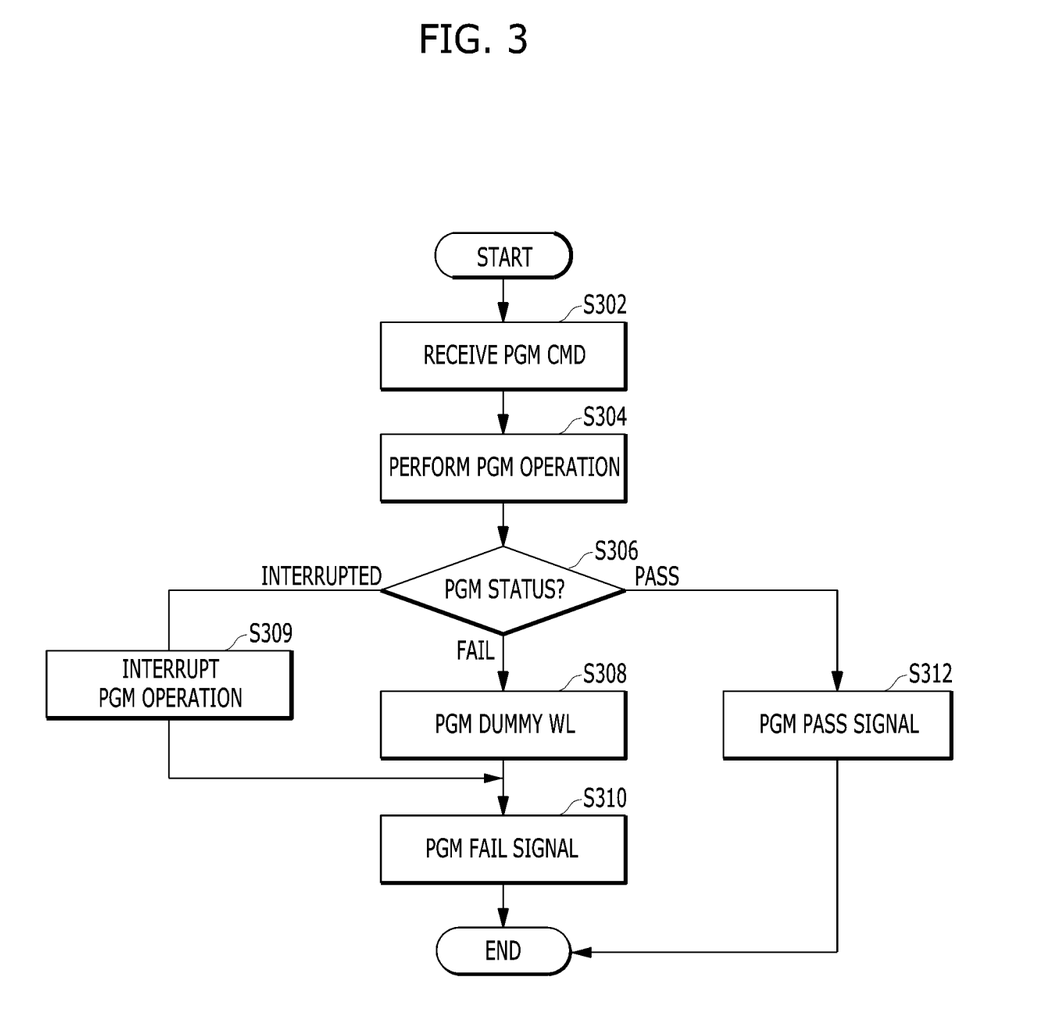
FIGS. 3 to 5 are flowcharts describing an operation of the memory device in accordance with embodiments of the present disclosure.

FIG. 3 is a flowchart illustrating an operation of the memory device 150 for the program command in accordance with an embodiment.

In step S302, the control logic 350 may receive a program command and program data from the controller 130.

In step S304, the memory device 150 may perform a program operation on a memory block in response to the program command. The program operation of step S304 will be described below in detail with reference to FIG. 4.

In step S306, the control logic 350 may determine a program status by the program operation of step S304.

When the program status is determined to be a pass ("PASS" in step S306), the control logic 350 may provide a program pass signal to the controller 130 in step S312.

When the program status is determined to be a fail ("FAIL" in step S306), the memory device 150 may perform steps S308 and S310.

The control logic 350 may control the voltage supply circuit 310 to program a dummy word line DWL of the memory block in step S308.

For example, the voltage supply circuit 310 may precharge all bit lines associated with the memory block to a program permission voltage. The program permission voltage may be a ground GND voltage. When the bit lines associated with the memory block are precharged to the program permission voltage, the voltage supply circuit 310 may apply a pass voltage to the main word lines MWL1 to MWLn. In an embodiment, the voltage supply circuit 310 may also apply the pass voltage to the dummy word line DWL. When the pass voltage is applied to the main word lines MWL1 to MWLn, the memory cells may be turned on within the memory block. When the program voltage is applied to the dummy word line DWL while the memory cells are being turned on, the dummy cells DC coupled to the dummy word line DWL may be programmed. The voltage supply circuit 310 may apply the program voltage to the dummy word line DWL, and thus increase the threshold voltages of dummy cells DC to a higher voltage than a normal pass voltage. The increased threshold voltages may indicate that the memory block is a defective block. The increased threshold voltage is referred to as an indication threshold voltage.

When the memory device 150 performs a normal read operation, no current may flow through all the bit lines associated with the memory block because the threshold voltages of all dummy cells DC are higher than the normal pass voltage. Therefore, the page buffer may buffer failure-mark data regardless of data stored in a selected memory cell. For example, the failure-mark data may be data whose all data bits are '0' or '1', depending on a value sensed from the bit lines BL1 to BLm when no current flows through the bit lines BL1 to BLm. The control logic 350 may determine whether the memory block is a defective block, based on the data buffered in the page buffer, during a subsequent program verify operation. When the memory block is determined as a defective block during the subsequent program verify operation, the control logic 350 may interrupt the program operation on the defective block.

When the program status is determined as interrupted ("INTERRUPTED" in step S306), the memory device 150 may perform steps S309 and S310. The memory device 150 may determine the program status as interrupted when the failure-mark data is detected in the verify operation.

In step S309, the memory device 150 may interrupt the program operation.

In step S310, the memory device 150 may provide a program fail signal to the controller 130.

Figure 4:
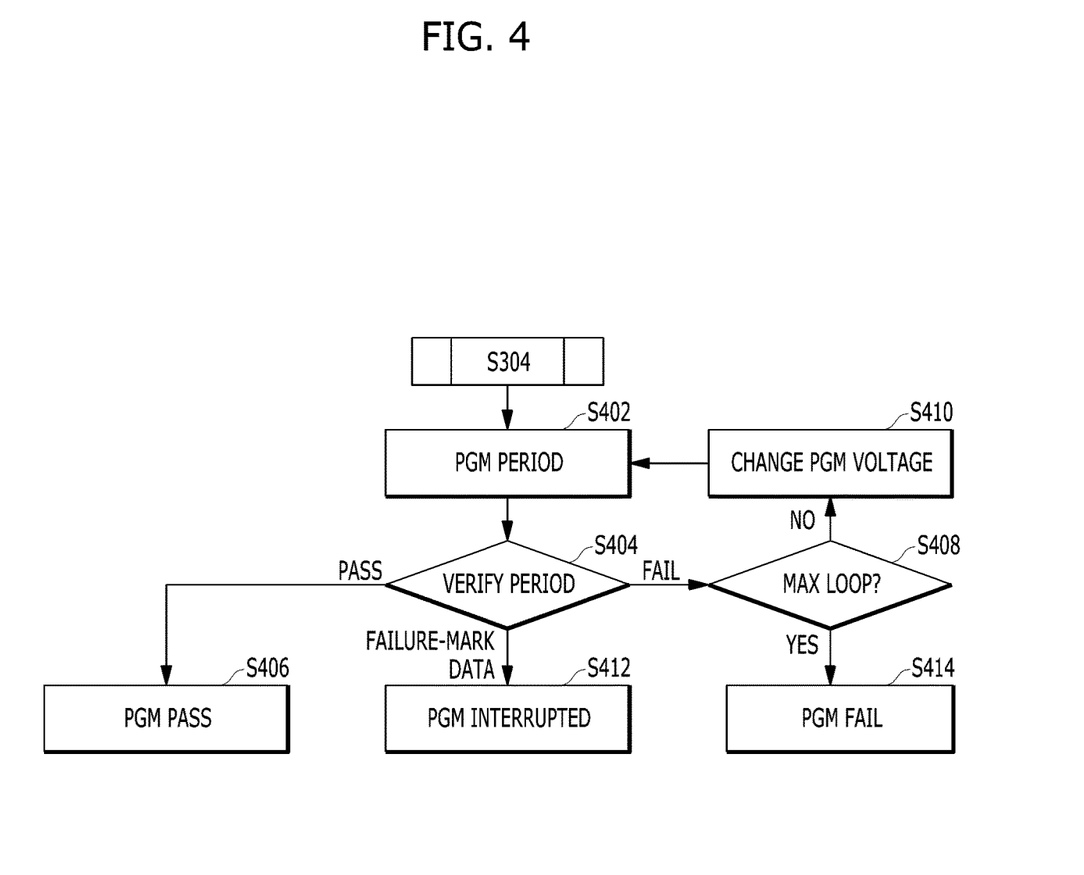

FIG. 4 is a flowchart illustrating the program operation of the memory device 150 in accordance with an embodiment. FIG. 4 illustrates sub operations which may be included in step S304.

A program operation may include a plurality of program loops. A program loop may include a program period and a program verify period.

Step S402 may correspond to the program period. The program period may include a setup sub-period, a pass pulse sub-period, a program pulse sub-period and a discharge sub-period.

During the setup sub-period, the voltage supply circuit 310 may precharge, to the program permission voltage, the bit line coupled to the selected string including the selected memory cell and may precharge, to the program inhibit voltage, the bit line coupled to the unselected string including the unselected memory cell. The bit line coupled to the selected string is referred to as a selected bit line. The bit line coupled to the unselected string is referred to as an unselected bit line. The program permission voltage may be the ground voltage GND. The program inhibit voltage may be the power voltage Vcc. During the setup sub-period, a select voltage may be applied to the drain select line DSL.

When the program permission voltage is applied to the selected bit line and the select voltage is applied to the drain select line DSL, the drain select transistor DST may be turned on. Therefore, the selected string may not be floated. The selected string may be precharged according to the program permission voltage applied to the selected bit line.

When the program inhibit voltage is applied to the unselected bit line and the select voltage is applied to the drain select line DSL, the drain select transistor DST may be turned off. Therefore, the unselected strings may be floated. A channel potential of the unselected string may increase by the select voltage. For example, the channel potential of the unselected string may increase to a level lowered from the select voltage by a threshold voltage of the drain select transistor DST.

During the pass pulse sub-period, the voltage supply circuit 310 may apply the pass voltage to the unselected word line coupled to the unselected memory cell. In an embodiment, the pass voltage may be applied to the selected word line coupled to the selected memory cell. When the pass voltage is applied to the selected word line, the selected memory cells included in the selected string may be turned on. Since a channel of the unselected string is floated, when the pass voltage is applied to the unselected word line, the channel potential of the unselected string may increase.

During the program pulse sub-period, the voltage supply circuit 310 may apply the program voltage to the selected word line. When difference between levels of the channel potential and the program voltage applied to the selected word line becomes equal to or greater than a reference value, the selected memory cell may be programmed. When the program voltage is applied to the selected word line, the selected memory cell included in the select string among the memory cells coupled to the selected word line may be programmed. Since the channel of the unselected string is floated, the channel potential of the unselected string may increase when the program voltage is applied to the selected word line. Since the channel potential of the unselected string increases simultaneously when the pass voltage and the program voltage are applied, the difference between the levels of the channel potential and the program voltage applied to the selected word line may be less than the reference value. Therefore, the memory cells included in the unselected string may not be programmed.

During the discharge sub-period, the voltage supply circuit 310 may discharge the voltage precharged to the bit line and the voltage applied to the word line.

Step S404 may correspond to the program verify period.

During the program verify period, the voltage supply circuit 310 may apply a verify voltage to the selected word line, and apply the pass voltage to the unselected word lines. The voltage supply circuit 310 may apply the normal pass voltage to the dummy word line DWL among the unselected word lines. The verify voltage may be a voltage for verifying whether the selected memory cells have an intended threshold voltage, and may have a value between two threshold voltage statuses among the voltage statuses which the memory cells may have.

The read/write circuit 320 may perform the verification operation by applying the verify voltage and the pass voltage to compare the data buffered in the page buffer with data received from the controller 130 and the failure-mark data. The failure-mark data indicates data buffered in the page buffer when the dummy memory cell DC is programmed to the indication threshold voltage. The failure-mark data may be sensed from the bit lines BL1 to BLm when no current flows through the bit lines BL1 to BLm.

When the data buffered in the page buffer is equal to the data received from the controller 130 ("PASS" in step S404), the control logic 350 may determine that the program status is the pass, in step S406.

When the data buffered in the page buffer is equal to the failure-mark data ("FAILURE-MARK DATA" in step S404), the control logic 350 may determine that the memory block is a defective block and thus may determine the program status as interrupted, in step S412.

In accordance with an embodiment, although a program command is provided for a defective block, the memory device 150 may apply only one program voltage in step S402, and interrupt the program operation according to the result of the application of the single program voltage. Since the program operation on the defective block is interrupted, the data stored in the defective block may be protected.

When the data buffered in the page buffer is different from both of the data received from the controller 130 and the failure-mark data ("FAIL" in step S404), the selected memory cell may not yet be completely programmed. The control logic 350 may determine whether the number of the program loops reaches a maximum, in step S408.

When the number of the program loops does not yet reach the maximum ("NO" in step S408), the control logic 350 may change the program voltage to be applied to the selected word line at the next program loop. For example, when the memory device 150 performs the program operation according to an ISPP (Incremental Step Pulse Program) method, the control logic 350 may increase the program voltage. Furthermore, the memory device 150 may perform step S402 again during the next program loop. For example, the selected memory cell having the threshold voltage higher than the verify voltage may become program-inhibited during the next program loop. For example, the selected memory cell having the threshold voltage equal to or lower than the verify voltage may stay program-allowed during the next program loop.

When the number of the program loops reaches the maximum ("YES" in step S408), the control logic 350 may determine that the program status is the fail.

Figure 5:
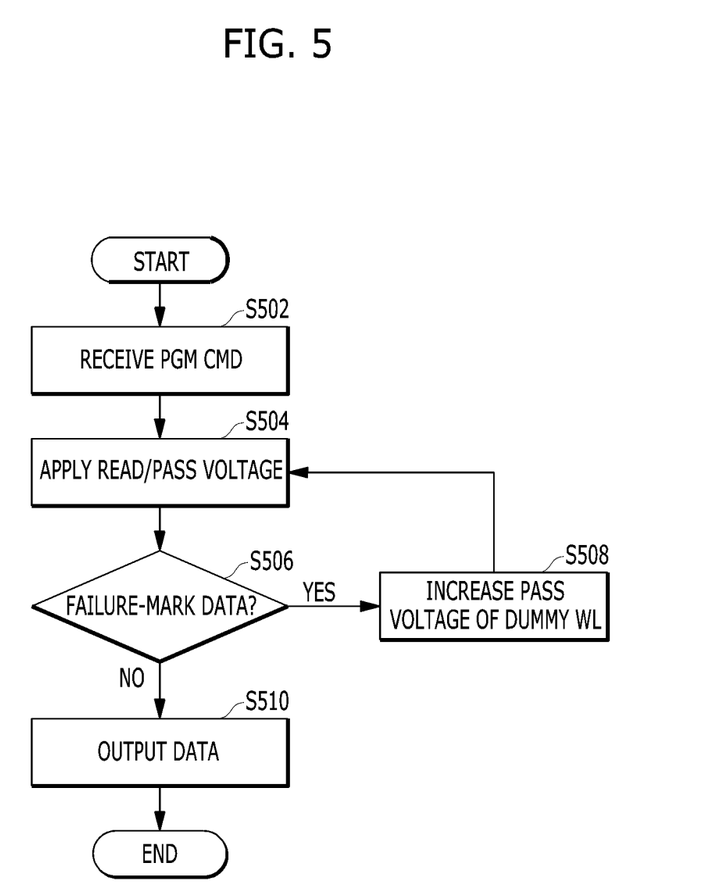

FIG. 5 is a flowchart illustrating an operation of the memory device 150 for a read command in accordance an embodiment.

In step S502, the control logic 350 may receive a read command from the controller 130.

In step S504, the voltage supply circuit 310 may apply the read voltage to a selected word line of a memory block associated with the read command, and apply the pass voltage to unselected word lines. When step S504 is performed for the first time, the control logic 350 may perform the normal read operation because the control logic 350 has not yet checked whether the memory block is a defective block. That is, the voltage supply circuit 310 may apply the normal pass voltage to a dummy word line DWL among the unselected word lines. Based on the threshold voltages of the memory cells, data may be buffered in the page buffer.

In step S506, the read/write circuit 320 may determine whether the data buffered in the page buffer is equal to the failure-mark data.

When the memory block associated with the read operation is a defective block, dummy cells DC included in the memory block may have the indication threshold voltage. Since the indication threshold voltage is higher than the normal pass voltage, no current may flow through all bit lines associated with the memory block as the result of the normal read operation. When no current flows through all the bit lines regardless of data which are actually stored in the selected memory cells, the failure-mark data may be buffered in the page buffer. When performing a normal read operation on a defective block, the memory device 150 cannot provide data provided by the controller 130.

When the data is different from the failure-mark data ("NO" in step S506), the control logic 350 may provide the data to the controller 130 in step S510.

When the data is equal to the failure-mark data ("YES" in step S506), the control logic 350 may determine that the memory block is a defective block, and increase the pass voltage applied to the dummy word line DWL, in step S508. For example, the memory device 150 may increase the pass voltage applied to the dummy word line DWL to a higher voltage than the indication threshold voltage.

The memory device 150 may perform step S504 again by applying the pass voltage higher than the indication threshold voltage to the dummy word line DWL, instead of performing a normal read operation. The read operation which is performed by applying the pass voltage higher than the indication threshold voltage to the dummy word line DWL is referred to as an additional read operation.

During the additional read operation, a current may not be interrupted in all the dummy cells DC included in the memory block. Therefore, when the additional read operation is performed, the data buffered in the page buffer in step S506 may be not the failure-mark data, but data which is actually programmed in the selected memory cell. In step S510, the read/write circuit 320 may provide the data to the controller 130.

In accordance with an embodiment, when performing a read operation on a defective block whose dummy cells DC have been programmed, the memory device 150 may perform an additional read operation by applying the pass voltage higher than the indication threshold voltage to the dummy word line DWL. The memory device 150 may read data stored in the defective block even though the dummy cells DC of the defective block were programmed and thus the threshold voltages of the dummy cells DC were increased.

In accordance with an embodiment, when a program fail occurs in a certain memory block, the memory device 150 may apply the program voltage to the dummy word line DWL such that the dummy cells DC of the memory block have the indication threshold voltage, thereby indicating that the memory block is a defective block.

During a normal read operation on a certain memory block, the memory device 150 may determine that the memory block is a defective block, when the failure-mark data is buffered in the page buffer because no current flows through the dummy cells DC. The memory device 150 may perform a normal read operation even during a program verify operation which is performed in response to a program command from the controller 130, and thus determine whether a memory block associated with the program command is a defective block.

Although a program command for a defective block is received from the controller 130, the memory device 150 may stop the program operation when the memory block associated with the program command is determined to be a defective block. Therefore, the memory device 150 may protect the data stored in the defective block without interrupting the operation of the pipeline scheme. That is, in accordance with various embodiments of the present disclosure, the performance and reliability of the memory system 110 including the memory device 150 may be improved.

Although various embodiments have been described for illustrative purposes, it will be apparent to those skilled in the art that various changes and modifications may be made without departing from the spirit and scope of the invention as defined in the following claims.

What is claimed is:

1. An operation method of a memory device, comprising:
performing a program operation on a memory block in response to a program command from a controller; and
applying a program voltage to a dummy word line coupled to dummy cells within the memory block such that the dummy cells have an indication threshold voltage higher than a normal pass voltage and providing a program fail signal to the controller when the program operation fails.

2. The operation method of claim 1, wherein the performing of the program operation comprises:
precharging a selected bit line to a program permission voltage, and precharging an unselected bit line to a program inhibit voltage;
applying a pass voltage to an unselected word line;
increasing threshold voltages of selected memory cells by applying a program voltage to selected word line;
performing a verify operation to verify the selected memory cells; and
providing a program fail signal to the controller when detecting failure-mark data as a result of the verify operation.

3. The operation method of claim 2, wherein the failure-mark data is detected when no current flows through bit lines coupled to the selected memory cells.

4. The operation method of claim 2, wherein the performing of the verify operation comprises:
applying a verify voltage to the selected word line;
applying a pass voltage to unselected word lines; and
applying a normal pass voltage to the dummy word line.

5. The operation method of claim 4, further comprising:
performing a normal read operation on a memory block in response to a read command from the controller;
retrying a read operation by applying a pass voltage higher than the indication threshold voltage to the dummy word line when the failure-mark data is read as the result of the normal read operation; and
providing the controller with data acquired as a result of the retrying.

6. A memory device comprising:
a memory block comprising memory cells and dummy cells;
a main word line coupled to the memory cells;
a dummy word line coupled to the dummy cells;
a voltage supply circuit suitable for:
performing a program operation on the memory block in response to a program command from a controller, and
applying a program voltage to the dummy word line such that the dummy cells have an indication threshold voltage higher than a normal pass voltage when the program operation fails; and
a control logic suitable for providing a program fail signal to the controller when the program operation fails.

7. The memory device of claim 6,
wherein, the voltage supply circuit performs the program operation by:
precharging a selected bit line to a program permission voltage, and precharging an unselected bit line to a program inhibit voltage,
applying a pass voltage to an unselected word line,
increasing threshold voltages of selected memory cells by applying a program voltage to a selected word line, and
performing a verification operation to verify the selected memory cells,
wherein the control logic provides the program fail signal to the controller when detecting failure-mark data as a result of the verify operation.

8. The memory device of claim 7, wherein the failure-mark data is detected when no current flows through bit lines coupled to the selected memory cells.

9. The memory device of claim 7, wherein the voltage supply circuit performs the verify operation by:
applying a verify voltage to the selected word line,
applying a pass voltage to unselected word lines, and
applying a normal pass voltage to the dummy word line.

10. The memory device of claim 9,
wherein the voltage supply circuit is further suitable for:
performing a normal read operation on a memory block in response to a read command from the controller, and
retrying a read operation by applying a pass voltage higher than the indication threshold voltage to the dummy world line when the failure-mark data is read as the result of the normal read operation,
further comprising a read/write circuit suitable for providing the controller with data acquired as a result of the retrying.

11. An operating method of a memory device, the operating method comprising:
applying, in response to a program command for a program-failed cell array, a program voltage to a dummy word line coupled to dummy cells within the program-failed cell array; and
providing, in response to a subsequent program command for the program-failed cell array, a program-failure signal when sensing failure-mark data from the program-failed cell array.

12. The operating method of claim 11, further comprising:
reading, in response to a subsequent read command for the program-failed cell array, data from the program-failed cell array by increasing a pass voltage applied to the dummy word line when sensing the failure-mark data from the program-failed cell array.

* * * * *